United States Patent
Fukushima et al.

(10) Patent No.: US 6,788,805 B1
(45) Date of Patent: Sep. 7, 2004

(54) ELECTRONIC COMPONENT-RECOGNIZING DEVICE

(75) Inventors: Hideaki Fukushima, Gunma-ken (JP); Yoshinori Ikeda, Tochigi-ken (JP); Kunimune Komaike, Gunma-ken (JP)

(73) Assignee: Hitachi High-Tech Instruments Co., Ltd., Gunma-Ken (JP)

( * ) Notice: Subject to any disclaimer, the term of this patent is extended or adjusted under 35 U.S.C. 154(b) by 578 days.

(21) Appl. No.: 09/629,808

(22) Filed: Jul. 31, 2000

(30) Foreign Application Priority Data

Aug. 3, 1999 (JP) ........................................... 11-220443

(51) Int. Cl.⁷ .............................................. G06K 9/00
(52) U.S. Cl. ................. 382/141; 250/559.22; 359/366; 359/387; 359/390; 362/558
(58) Field of Search ................................ 382/141, 145, 382/147, 151, 152, 174; 362/355, 237, 398, 244, 227, 239–252, 382, 558; 250/559.17, 559.34, 559.22, 201.3; 359/789, 707, 387, 385–390, 599, 656, 613, 366

(56) References Cited

U.S. PATENT DOCUMENTS

| | | | | |
|---|---|---|---|---|
| 4,423,909 A | * | 1/1984 | Page et al. ................. | 303/22.2 |
| 4,567,551 A | * | 1/1986 | Choate ....................... | 362/398 |
| 4,798,963 A | * | 1/1989 | Wittkopp et al. ........ | 250/559.22 |
| 4,801,810 A | * | 1/1989 | Koso ........................ | 250/559.34 |
| 5,012,115 A | * | 4/1991 | Asai et al. ............... | 250/559.17 |
| 5,088,187 A | * | 2/1992 | Takata et al. ............. | 29/705 |
| 5,690,417 A | * | 11/1997 | Polidor et al. ............ | 362/244 |
| 5,842,060 A | | 11/1998 | White et al. | |

FOREIGN PATENT DOCUMENTS

| | | |
|---|---|---|
| EP | 0 336 114 | 3/1989 |
| EP | 06061700 | 3/1993 |
| JP | 04211523 | 7/1992 |

* cited by examiner

Primary Examiner—Timothy M. Johnson
Assistant Examiner—Sheela Chawan
(74) Attorney, Agent, or Firm—Darby & Darby

(57) ABSTRACT

There is provided an electronic component-recognizing device for taking an image of an electronic component brought to a component-sensing station, for recognition thereof. The component-sensing camera takes the image of the electronic component by utilizing reflected light from the electronic component. A lighting mechanism lights the electronic component. The lighting mechanism comprises a light-guiding element, a ring light guide, and a light source. The light-guiding element is arranged annularly such that the light-guiding element can diffuse illumination light and emit the diffused illumination light toward the electronic component obliquely from below. The ring light guide holds the light-guiding element. A light source supplies the illumination light to the light-guiding element.

12 Claims, 4 Drawing Sheets

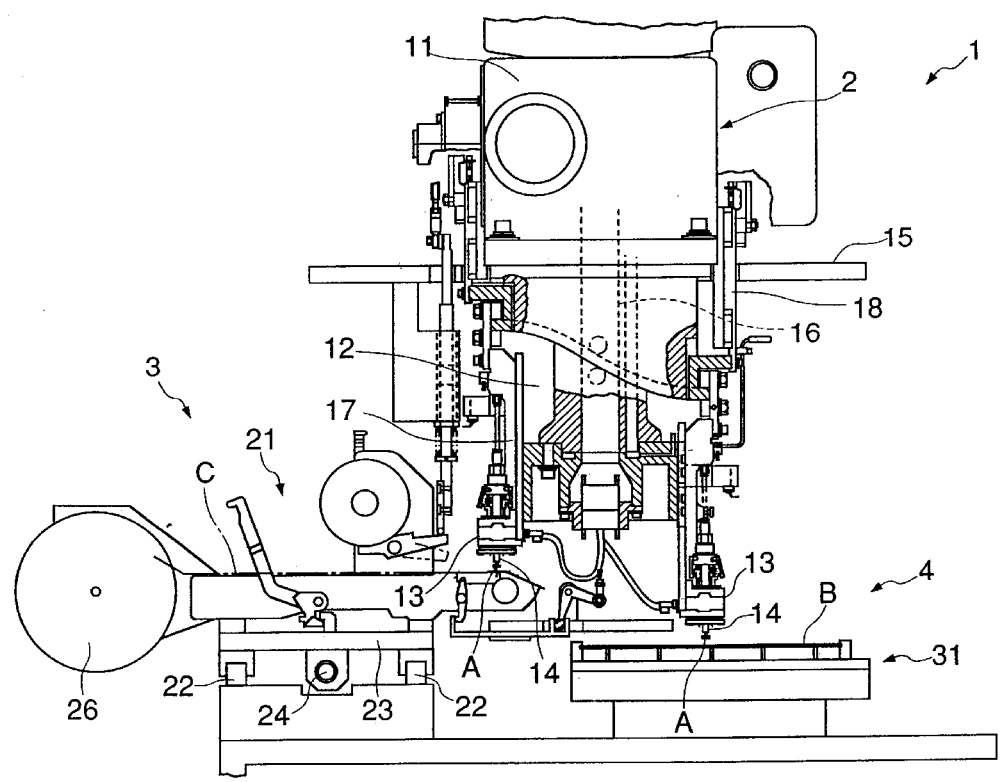
F I G. 1

ELECTRONIC COMPONENT-RECOGNIZING DEVICE

BACKGROUND OF THE INVENTION

1. Field of the Invention

This invention relates to an electronic component-recognizing device for taking an image of an electronic component lighted from below.

2. Prior Art

Conventionally, an electronic component-recognizing device of this kind has been disclosed e.g. in Japanese Laid-Open Patent Publication (Kokai) No. 6-61700. The electronic component-recognizing device includes a component-sensing camera for taking an image of an electronic component by utilizing reflected light from the electronic component, and a lighting mechanism for lighting from below the electronic component brought to a component-sensing station. The lighting mechanism is comprised of a light-emitting element formed to have an annular shape, a light guide for guiding light to the light-emitting element, and a lamp for launching light into the light guide. Illumination light emitted from the light-emitting element is reflected back from an electronic component, and the reflected light is taken into the component-sensing camera via an inner opening of the light-emitting element. The light-emitting element has an inner periphery thereof formed with a plurality of reflecting surfaces where exposed are output end faces of a large number of optical fibers forming the light guide from all radial directions, and which reflect output light from the optical fibers toward the electronic component at various angles. This permits an underside surface of the electronic component to be lighted from the various angles.

However, in the conventional electronic component-recognizing device, to illuminate an electronic component from the various angles, the inner periphery of the light-emitting element has the plurality of reflecting surfaces formed in a stepped manner or in tiers, which inevitably complicates the shape of the inner periphery, and hence machining of this portion of the device takes much time and labor, resulting in increased manufacturing costs of the device. Further, since the plurality of reflecting surfaces are formed in a stepped manner or in tiers as described above, the height of the whole light-emitting element is increased, and hence it is required to set an image-taking position at which an image of an electronic component is taken at a high location so as to prevent interference between the electronic component and the light-emitting element. As a result, the inner opening of the light-emitting element for taking in reflected light from the electronic component is also required to have an increased diameter, and at the same time, the distance between the output end of the light guide and the component-sensing camera is increased, which tends to attenuate the reflected illumination light and make the same nonuniform.

SUMMARY OF THE INVENTION

It is an object of the invention to provide an electronic component-recognizing device that is compact in size and simple in construction and enables an electronic component to be uniformly illuminated with light.

To attain the above object, the present invention provides an electronic component-recognizing device for taking an image of an electronic component brought to a component-sensing station, for recognition thereof, the electronic component-recognizing device including a component-sensing camera for taking the image of the electronic component by utilizing reflected light from the electronic component, and a lighting mechanism for lighting the electronic component.

The electronic component-recognizing device according to the invention is characterized in that the lighting mechanism comprises:

a light-diffusing radiator arranged annularly such that the light-diffusing radiator can diffuse illumination light and emit the diffused illumination light toward the electronic component obliquely from below;

a radiator holder for holding the light-diffusing radiator; and a light source for supplying the illumination light to the light-diffusing radiator.

According to this electronic component-recognizing device, the lighting mechanism diffuses illumination light and emits the diffused illumination light toward an electronic component. Therefore, the electronic component-recognizing device is capable of irradiating the electronic component from many different angles without a plurality of reflecting surfaces formed in a stepped manner or in tiers. Further, since it is not required to form the plurality of reflecting surfaces in a stepped manner, it is possible to reduce the size of the light-diffusing radiator and simplify the shape of the same, thereby reducing machining cost of the device. Moreover, the reduction of the size of the light-diffusing radiator allows the height of the lighting mechanism to be reduced and an image-taking position for taking an image of the electronic component to be set at a lower location. As a result, an opening inward of the light-diffusing radiator, for taking in the reflected light can also be reduced in diameter. Additionally, the reduction of the size of the light-diffusing radiator makes it possible to shorten an optical path between the output end of the light source and respective portions of the light-diffusing radiator, thereby reducing attenuation of the illumination light to maintain uniform light radiation. In short, the electronic component-recognizing device according to the invention has a compact and simple construction that enables uniform lighting of an electronic component.

Preferably, the light-diffusing radiator is formed as a unitary annular member, and has an light-emitting surface having a convex arcuate cross-sectional profile with at least one normal on the convex arcuate cross-sectional profile being directed toward the electronic component.

According to this preferred embodiment, the light-diffusing radiator has a light-emitting surface formed to have a convex arcuate cross-sectional profile and having one or more normals on the convex accurate cross-sectional profile directed toward the electronic component. Therefore, it is possible to diffuse illumination light supplied from the light source for irradiation and uniformly emit the diffused illumination light in a large area around each normal, and hence it is possible to carry out light radiation which is effective when an area to be uniformly lighted is large, e.g. in the case of taking an image of a relatively large electronic component from a close position.

Alternatively, the light-diffusing radiator is formed as a unitary annular member and has an light-emitting surface having a concave arcuate cross-sectional profile with at least one normal on the concave arcuate cross-sectional profile being directed toward the electronic component.

According to this preferred embodiment, the light-diffusing radiator has a light-emitting surface formed to have a concave arcuate cross-sectional profile with one or more normals on concave arcuate cross-sectional profile being directed toward the electronic component. Therefore, it is possible to diffuse illumination light supplied from the light source for irradiation and uniformly emit the diffused illumination light such that light beams converge in the vicinity of each normal. This makes it possible to carry out light radiation which is effective when an area to be uniformly lighted is small and high resolution is required, e.g. in the case of taking an image of a relatively small electronic component from a remote position.

Preferably, the light-diffusing radiator is formed of an acrylic resin.

According to this preferred embodiment, the acrylic resin is used as the material of the light-diffusing radiator. Therefore, it is possible to mass-produce light-diffusing radiators which are compact in size and uniform in shape, thereby contributing to improved uniformity of light radiation as well as further reduction of the size and manufacturing costs of the device. In addition, the use of the resin makes it easy to change the shape (in cross section) of a light-diffusing radiator. Therefore, it is also possible to form a light-diffusing radiator into a desired shape, to thereby change the area to be irradiated with light. In short, the use of the resin makes it possible to increase the freedom of shaping the light-diffusing radiator.

Preferably, the radiator holder is arranged radially outward of the light-diffusing radiator, and contains at least one optical fiber for supplying the illumination light to the light-diffusing radiator.

Preferably, the electronic component-recognizing device further includes a beam splitter arranged downward of the light-diffusing radiator, for guiding the reflected light from the electronic component toward the component-sensing camera.

More preferably, the electronic component-recognizing device further includes a light-emitting surface element arranged downward of the beam splitter such that an optical axis of the light-emitting surface element coincides with a center line of the electronic component, for irradiating the electronic component with illumination light.

The above and other objects, features, and advantages of the invention will become more apparent from the following detailed description taken in conjunction with the accompanying drawings.

BRIEF DESCRIPTION OF THE DRAWINGS

FIG. 1 is a side elevation, partly in cross-section, of an electronic component-mounting apparatus incorporating an electronic component-recognizing device according to an embodiment of the invention;

DETAILED DESCRIPTION

The invention will now be described in detail with reference to drawings showing an embodiment thereof. In the embodiment, an electronic component-recognizing device according to the invention is installed on an electronic component-mounting apparatus.

Figure 2:
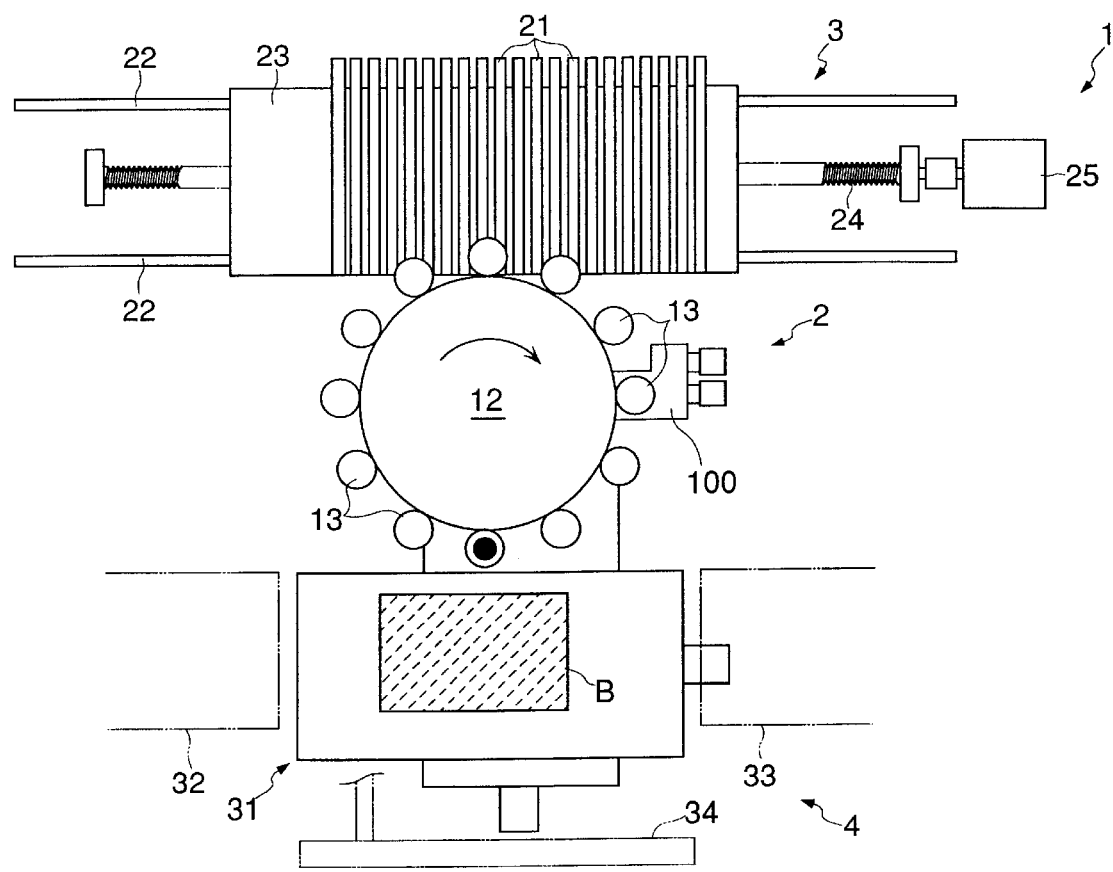
FIG. 2 is a plan view of the FIG. 1 electronic component-mounting apparatus.

Referring first to FIGS. 1 and 2, there is shown an electronic component-mounting apparatus 1 which includes a main unit 2, a feeding section 3 for feeding electronic components A, and a mounting section 4 for mounting the electronic components A on a circuit board B, with the feeding section 3 and the mounting section 4 being arranged on opposite sides of the main unit 2 in a manner parallel to each other. The main unit 2 is comprised of an index unit 11 which forms a main part of the driving system of the apparatus, a rotary table 12 coupled thereto, and a plurality of (twelve, in the present embodiment) mounting heads 13 arranged on the outer periphery of the rotary table 12. The rotary table 12 is intermittently rotated by the index unit 11 in angular increments dependent on the number of the mounting heads 13. With intermittent rotation of the rotary table 12, a selected one of vacuum nozzles 14 carried by each mounting head 13 is properly brought to the feeding section 3 and the mounting section 4, whereby each selected vacuum nozzle 14 picks up by vacuum an electronic component A supplied at the feeding section 3, carries the same to the mounting section 4 through intermittent rotation of the rotary table 12, and mounts the same on a circuit board B supplied at the mounting section 4.

The feeding section 3 has tape cassettes 21 corresponding in number to the number of kinds of electronic components A to be mounted on the circuit board B. The tape cassettes 21 are removably mounted on a feed table 23 in parallel with each other perpendicularly to the directions of forward/backward movements of the feed table 23. The feed table 23 is slidably guided by a pair of guide rails 22, 22. A ball screw 24 extends through the feed table 23 in a direction of its sliding on the guide rails 22, whereby the feed table 23 is moved forward and backward by respective normal and reverse rotations of a feed motor 25 connected to one end of the ball screw 24, to selectively bring a selected one of the tape cassettes 21 to a pickup station for the mounting heads 13. Each tape cassette 21 contains a roll of a carrier tape C which carries electronic components A thereon at intervals of a predetermined pitch and is wound around a tape reel 26, and the electronic components A are sequentially picked up by a corresponding one of the vacuum nozzles 14 by vacuum as the carrier tape C is unwound from the tape reel 26.

The mounting section 4 is comprised of an X-Y table 31 for moving a circuit board B placed thereon in the directions of an X axis and a Y axis, a feed conveyor 32 and a delivery conveyor 33 arranged to face respective opposite longitudinal ends of the X-Y table 31, and a circuit board transfer device 34 for transferring a circuit board B on the feed conveyor 32 onto the X-Y table 31 and at the same time transferring a preceding circuit board B already placed on the X-Y table onto the delivery conveyor 33. That is, the circuit board B sent to a downstream end of the feed conveyor 32 is transferred by the circuit board transfer device 34 onto the X-Y table 31, and at the same time, the circuit board B having electronic components A mounted thereon is transferred by the circuit board transfer device 34 onto the delivery conveyor 33. The circuit board B placed on the X-Y table 31 is moved to its predetermined positions by the X-Y table 31 such that specific portions thereof are sequentially brought to a mounting station for the mounting heads 13, at which each electronic component A held at a selected vacuum nozzle 14 of each mounting head 13 is mounted at its specific portion of the circuit board B.

The index unit 11 of the main unit 2, which forms the main part of the whole driving system of the apparatus, is supported by a support table 15. The index unit 11 intermittently rotates the rotary table 12, and at the same time causes various devices mounted on the main unit 2 to operate in a manner synchronous with a repetition period of intermittent rotation of the rotary table 12.

The rotary table 12 is rigidly mounted on a vertical shaft 16 extending perpendicularly downward from the index unit 11 and is driven for clockwise intermittent rotation as viewed in FIG. 2. The twelve mounting heads 13 are arranged at circumferential intervals along the periphery of the rotary table 12 such that they are vertically movable via respective brackets 17. In the present embodiment, the rotary table 12 performs twelve intermittent rotations or index motions corresponding in number to the number of mounting heads 13 to make one complete rotational turn. The mounting heads 13, which intermittently move about the rotational axis of the rotary table 12, are sequentially brought to twelve stations including the pickup station in the feeding section, at which electronic components A are picked up by vacuum by respective selected vacuum nozzles 14, and the mounting station in the mounting section, at which the picked electronic components A are sequentially mounted on a circuit board B as well as a station at which an image of the picked electronic component is taken, a station at which the orientation of the same is corrected if required, and a station at which nozzles are changed (or switched).

Now, a sequence of the whole operation of the main unit 2 will be briefly described by taking operations of one of the mounting heads 13 as an example. After having mounted an electronic component A on a circuit board B at the mounting station, the mounting head 13 is intermittently moved about the rotational axis of the rotary table 12 toward the pickup station by intermittent rotation of the rotary table 12. Before the mounting head 13 reaches the pickup station, selection of a vacuum nozzle 14, projection/retraction of the vacuum nozzles 14, adjustment of a projected part of the selected vacuum nozzle 14, and correction of the position of the selected vacuum nozzle 14 are sequentially effected based on control commands for the mounting head 13. On the other hand, in the feeding section 3, as the mounting head 13 is moved from the station immediately preceding the pickup station to the pickup station, the feed table 23 is moved forward or backward to bring one of the tape cassettes 21 which corresponds to the selected vacuum nozzle 14, to the pickup station based on a control command.

The mounting head 13 picks up an electronic component A by vacuum at the pickup station, and is moved about the rotational axis of the rotary table 12 this time toward the mounting station. Before the mounting head 13 reaches the mounting station, returning of the vacuum nozzle 14 to the original nozzle-setting position, recognition of the electronic component A picked up, and correction of angle or orientation of the electronic component A based on results of the recognition are sequentially effected by respective control commands. In the mounting section, as the mounting head 13 is moved from the station immediately preceding the mounting station to the mounting station, the X-Y table 31 is moved based on a control command, thereby bringing a portion of the circuit board B at which the electronic component A is to be mounted to the mounting station. Then, the mounting head-lifting/lowering device 18 lowers the mounting head 13 to thereby cause the electronic component A to be mounted on the circuit board B.

The electronic component-recognizing device 100 according to the present embodiment recognizes an orientation (on a horizontal plane) of the electronic component A held at the vacuum nozzle 14 based on a image thereof sensed at a predetermined component-sensing station (see FIG. 2) between the pickup station and the mounting station. At the following station, the vacuum nozzle 14 is moved about the vertical axis of the mounting head 13 based on results of recognition of the electronic component A by the component-recognizing device 100, whereby the orientation or attitude of the electronic component A held at the vacuum nozzle 14 is corrected such that it is suitable for mounting of the electronic component A.

Figure 3:
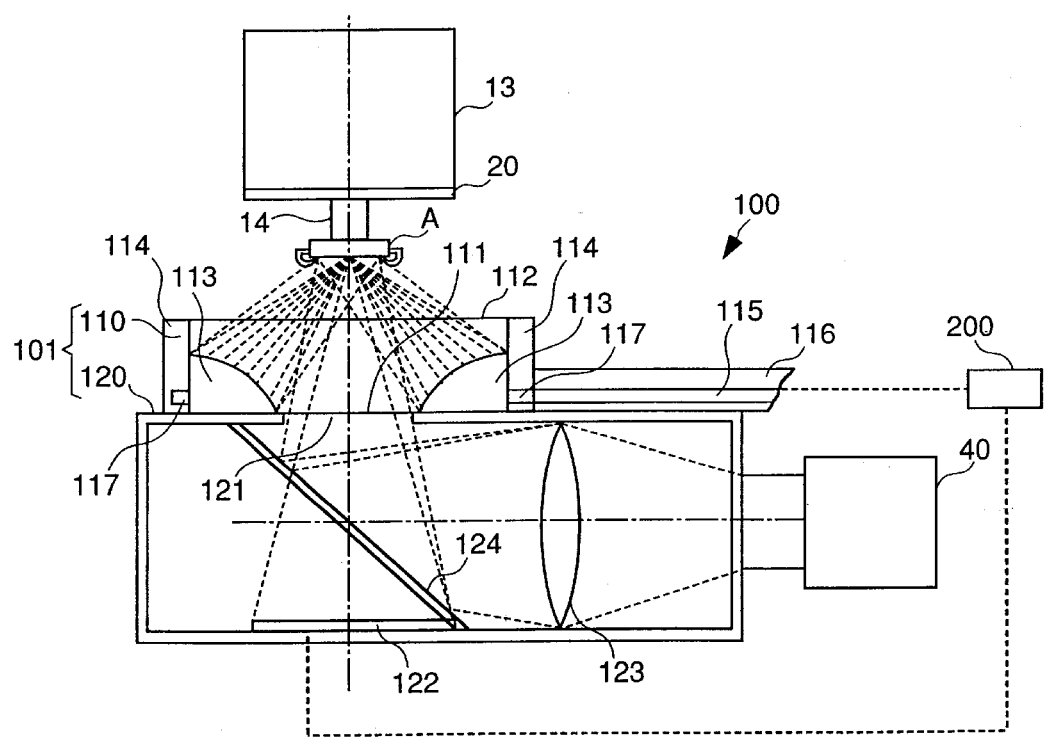
FIG. 3 is a side sectional view of the electronic component-recognizing device according to the embodiment.

Next, the electronic component-recognizing device 100 will be described in detail with reference to FIGS. 3 and 4A to 4C. As shown in FIG. 3, the electronic component-recognizing device 100 includes a component-sensing camera 40 for taking an image of an electronic component A by utilizing reflected light therefrom, and a lighting mechanism 101 for lighting the electronic component A brought to the predetermined component-sensing station directly above the lighting mechanism 101 itself, obliquely from below. Further, the lighting mechanism 101 is comprised of an irradiation block 110 for irradiating the electronic component A with diffuse light, and a guide block 120 that guides reflected light from the electronic component A to the component-sensing camera 40 and at the same time mechanically supports the irradiation block 110.

As shown in FIG. 3, at a central portion of an upper wall of the guide block (main box) 120, there is formed a circular opening 121 for letting in the reflected light from the electronic component A to guide the same to the component-sensing camera 40, and a light-emitting surface element 122 is arranged on an inner bottom surface of the guide block 120. The light-emitting surface element 122 has a structure of woven optical fibers and diffuses light by a diffusion member thereof to thereby cause the light to be emitted from the whole surface of the light-emitting surface element 122. Further, within the main box 120, there are arranged a lens 123 for collecting reflected light and guiding the collected reflected light to the component-sensing camera 40, and a beam splitter 124 for reflecting the reflected light from the electronic component A to thereby guide the same to the lens 123 and at the same time allowing the light emitted from the light-emitting surface element 122 to pass therethrough with an optical axis of the beam splitter being made coincident with a center line of the electronic component A.

As shown in FIGS. 3 and 4A to 4C, the irradiation block 110 has an upper portion covered with transparent glass or the like for preventing dust or dirt from entering the irradiation block 110 and formed with an opening 112 via which the reflected light from the electronic component A is taken in, and a lower portion formed with an opening 111 via which the reflected light is passed into the opening 121 of the main box 120. Further, the irradiation block 110 has an annular light-guiding element (light-diffusing radiator) 113 formed in a manner surrounding the opening 111 and arranged about the center line of the electronic component A, an annular ring light guide (radiator holder) 114 for holding the light-guiding element 113, and a light source 200 formed by a halogen lamp or the like.

The ring light guide 114 is connected to the light source 200 by an optical fiber bundle 116 having a plurality of optical fibers 115 for guiding light from the light source 200 to the irradiation block 110. Further, embedded in the ring light guide 114 are a large number of optical fibers 117 having respective inner end faces thereof arranged annularly around the light-guiding element 113 and directed radially inward to face the light-guiding element 113 for supplying light thereto from locations of the annular ring light guide 114 located radially outward of the light-guiding element 113.

Figure 4A:
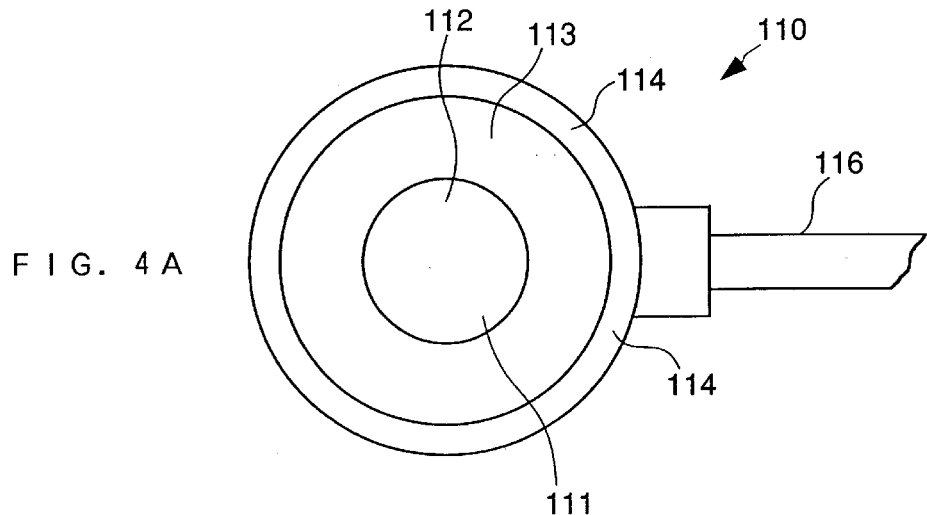
FIG. 4A is a plan view of a light-guiding element of the electronic component-recognizing device.
Figure 4B:
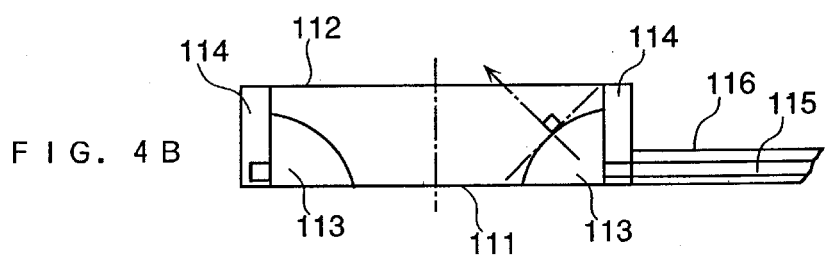
FIGS. 4B and 4C are side sectional views of the light-guiding element.
Figure 4C:
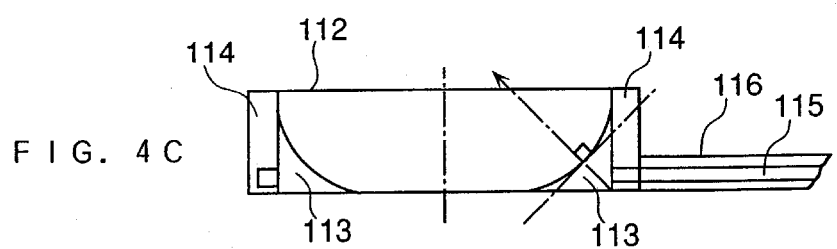

The light-guiding element 113 is formed in one piece e.g. of an acrylic resin to have an annular shape and constructed such that the light supplied thereto from the ring light guide 114 is diffused by the acrylic resin having a predetermined refractive index and uniform illumination light is emitted from all over the light-emitting surface thereof toward the electronic component A. As shown in FIGS. 4B and 4C, there are provided a plurality of (two, in the present embodiment) types of light-guiding elements 113 which are different in shape. FIG. 4B shows a light-guiding element 113 whose light-emitting surface has a convex arcuate cross-sectional profile. More specifically, the light-emitting surface of the FIG. 4B light-guiding element 113 is formed to have a convex arcuate profile in radial cross-section such that at least one of normals extending from tangent points on respective imaginary tangential lines touching the convex arcuate profile of the light-emitting surface is directed (as an optical axis, in the embodiment) toward the electronic component A whose image is to be taken. On the other hand, FIG. 4C shows a light-guiding element 113 whose light-emitting surface has a concave arcuate cross-sectional profile. This light-guiding element 113 also has at least one of normals on the concave arcuate cross-sectional profile, which is directed toward the electronic component A whose image is to be taken.

A diffusion plate 20 is attached to an underside portion of the mounting head 13, for preventing required reflected light (i.e. component recognition based on the reflected light) from being adversely affected by irregular reflection of the illumination light emitted from the light-guiding element 113. The central portion of the electronic component A is also irradiated with illumination light from the light-emitting surface element 122 such that the electronic component A receives light uniformly from almost all directions. The illumination light emitted from the light-guiding element 113 and so forth for uniform lighting is reflected off the electronic component A. Then, the reflected light which has passed through the openings 112, 111, 121 is reflected at the beam splitter 124 and then collected by the lens 123. Subsequently, the collected light is taken into the component-sensing camera 40, whereby an image of the electronic component A is formed for recognition of the same.

As described above, since the lighting mechanism 101 emits illumination light toward an electronic component A in a diffused manner, the electronic component-recognizing device 100 is capable of irradiating the electronic component A from many different angles without a plurality of reflecting surfaces formed in a stepped manner or in tiers. Further, since it is not required to form a plurality of reflecting surfaces in tiers, it is possible to reduce the size of the light-guiding element 113 serving as a light (diffusing) radiator and simplify the shape of the same, thereby reducing machining cost of the device. Moreover, the reduction of the size of the light-guiding element 113 allows the height of the lighting mechanism 101 to be reduced and an image-taking position for taking an image of the electronic component A to be set at a lower location. As a result, the openings 111, 121 for taking in reflected light can also be reduced in diameter. Additionally, the reduction of the size of the light-guiding element 113 makes it possible to shorten optical paths between the output end of the light source 200 and relevant portions of the light-guiding element 113, thereby reducing attenuation of the illumination light to maintain uniform light radiation from these portions. In short, the component-recognizing device 100 according to the embodiment has a compact and simple construction that enables uniform lighting of an electronic component A.

Further, when, as shown in FIG. 4B, the light-guiding element (light-diffusing radiator) 113 has a light-emitting surface formed to have a convex arcuate cross-sectional profile and having a normal directed toward an electronic component A whose image is to be taken, light supplied from the light source 200 for irradiation can be emitted in a uniformly diffused manner toward a large area around the normal, and hence it is possible to carry out light radiation which is effective when an area to be uniformly irradiated is large, e.g. in the case of taking an image of a relatively large electronic component A from a close position. On the other hand, when, as shown in FIG. 4C, the light-guiding element 113 has a light-emitting surface formed to have a concave arcuate cross-sectional profile and having a normal on the concave arcuate profile directed toward an electronic component A whose image is to be taken, light supplied from the light source 200 for irradiation can be emitted in a uniformly diffused manner such that light beams converge in the vicinity of the normal, and hence it is possible to carry out light radiation which is effective when an area to be uniformly irradiated is small, and high resolution is required, e.g. in the case of taking an image of a relatively small electronic component A from a remote position.

Further, the use of an acrylic resin as the material of the light-guiding element 113 enables mass production of the same (light diffusing radiators) which are compact in size and uniform in shape, contributing to realization of further improved uniformity of light radiation as well as further reduction of the size and manufacturing costs of the same. In addition, the use of the resin makes it easy to change the shape of the light-guiding element 113. Therefore, it is also possible to configure the light-guiding element 113 such that it has a desired shape, to thereby change the area to be irradiated with light. In short, the use of the resin makes it possible to increase the freedom of shaping the light-guiding element 113.

It is further understood by those skilled in the art that the foregoing are preferred embodiments of the invention, and that various changes and modifications may be made without departing from the spirit and scope thereof.

What is claimed is:

1. An electronic component-recognizing device for taking an image of an electronic component at a component sensing station, comprising:
   a light source for supplying illumination light;
   a light-diffusing radiator for receiving said illumination light from said light source and radiating diffused light to the component at said sensing station which comprises a unitary annular member having a light-emitting surface with a convex arcuate cross-sectional profile with at least one normal on said convex arcuate cross-sectional profile being directed toward said electronic component; and
   a camera for receiving an image of the electronic component from light reflected from the component at the sensing station.

2. An electronic component-recognizing device according to claim 1, wherein said light-diffusing radiator is formed of an acrylic resin.

3. An electronic component-recognizing device according to claim 1, further comprising a radiator holder holding said light-diffusing radiator arranged radially outward of said light-diffusing radiator, and having at least one optical fiber for supplying said illumination light to said light-diffusing radiator.

4. An electronic component-recognizing device according to claim 1, further comprising a beam splitter arranged down stream of said light-diffusing radiator, for guiding said reflected light from said electronic component toward said component-sensing camera.

5. An electronic component-recognizing device according to claim 4 further comprising a light-emitting surface element arranged down stream of said beam splitter such that an optical axis of said light-emitting surface element coincides with a center line of said electronic component, for irradiating said electronic component with illumination light.

6. An electronic component-recognizing device according to claim 1 wherein said light diffusing radiator is located below the component sensing station and radiates the light upwardly to the station.

7. An electronic component-recognizing device for taking an image of an electronic component at a component sensing station, comprising:
   a light source for supplying illumination light;
   a light-diffusing radiator for receiving said illumination light from said light source and radiating diffused light to the component at said sensing station which comprises a unitary annular member having light-emitting surface having a concave arcuate cross-sectional profile with at least one normal on said concave arcuate cross-sectional profile being directed toward said electronic component; and
   a camera for receiving an image of the electronic component from light reflected from the component at the sensing station.

8. An electronic component-recognizing device according to claim 7, wherein said light-diffusing radiator is formed of an acrylic resin.

9. An electronic component-recognizing device according to claim 7 further comprising a radiator holder holding said light-diffusing radiator arranged radially outward of said light-diffusing radiator, and having at least one optical fiber for supplying said illumination light to said light-diffusing radiator.

10. An electronic component-recognizing device according to claim 7 further comprising a beam splitter arranged down stream of said light-diffusing radiator, for guiding said reflected light from said electronic component toward said component-sensing camera.

11. An electronic component-recognizing device according to claim 10, further comprising a light-emitting surface element arranged down stream of said beam splitter such that an optical axis of said light-emitting surface element coincides with a center line of said electronic component, for irradiating said electronic component with illumination light.

12. An electronic component-recognizing device according to claim 7 wherein said light diffusing radiator is located below the component sensing station and radiates the light upwardly to the station.

* * * * *